United States Patent [19]

Dutt

[11] Patent Number: 4,571,359

[45] Date of Patent: Feb. 18, 1986

[54] PAPERMAKERS WET-PRESS FELT AND METHOD OF MANUFACTURE

[75] Inventor: William H. Dutt, Rensselaer, N.Y.

[73] Assignee: Albany International Corp., Albany, N.Y.

[21] Appl. No.: 683,025

[22] Filed: Dec. 18, 1984

[51] Int. Cl.⁴ ............................................. B32B 5/16
[52] U.S. Cl. .................................... 428/240; 156/283; 428/283; 428/296
[58] Field of Search ................ 156/283; 428/240, 281, 428/283, 296, 327

[56] References Cited

U.S. PATENT DOCUMENTS 4,357,386 11/1982 Luciano et al. ..................... 428/240

Primary Examiner—James J. Bell
Attorney, Agent, or Firm—Kane, Dalsimer, Kane, Sullivan and Kurucz

[57] ABSTRACT

The disclosure is of a composite papermakers felt made up of a textile base layer, and a surface layer of polymeric resin particles which have been fused together to form a porous covering. The felt is useful in the wet press section of a papermaking machine. The disclosure is also of a method of manufacturing the felt of the invention.

2 Claims, 3 Drawing Figures

PAPERMAKERS WET-PRESS FELT AND METHOD OF MANUFACTURE

BACKGROUND OF THE INVENTION

1. Field of the Invention

The invention relates to papermakers felts and methods of their manufacture and more particularly relates to composite felts comprising a woven textile base and a layer of a flexible, polymeric resin. The composite felts of the invention are useful in the wet-press section of a papermaking machine.

2. Brief Description of the Prior Art

The modern papermaker employs a highly sophisticated machine to make paper, which is named rather appropriately a "papermaking machine". The modern papermaking machine is in essence a device for removing water from the paper furnish. The water is removed sequentially in three stages or sections of the machine. In the first or forming section, the furnish is deposited on a moving forming wire and water drained through the wire to leave a paper sheet or web having a solids content of circa 18 to 25 percent by weight. The formed web is carried into a wet press felt section and passed through one or more nip presses on a moving press felt to remove sufficient water to form a sheet having a solids content of 36 to 44 percent by weight. This sheet is then transferred to the dryer section of the papermaking machine where dryer felts press the paper sheet against hot, steam-heated dryer cylinders to obtain about 92 to 96 percent solids content.

The clothing employed on the paper making machine must perform a widely diverse range of functions, according to the position on the machine, i.e., forming, press or dryer section. In view of the diversity of functions, the clothing for use in each section of the machine must be manufactured to meet specific design requirements essential to the particular section. In the absence of meeting the specific felt design requirements demanded in each section of the machine, the overall operation of the machine will be unsatisfactory. Optimum operating lives of the felts will not be achieved, product quality may be adversely affected, machine speeds may be lowered or drying efficiency may be impeded.

Those skilled in the art have long appreciated that the efficiency of water removal in the wet press section of the papermaking machine is critical to overall efficiency in the papermaking process. This is because, first a large amount of water must be removed from the sheet at the presses to realize a good drying economy. Secondly, greater efficiency in water removal creates a drier and hence stronger sheet less susceptible to breaking. A large variety of clothing constructions have been proposed as papermakers felts advantageously employed in the press section of a papermaking machine. In fact, there has been a continual evolution of clothing constructions, corresponding to improvements in the papermaking machine itself. This evolution began with the early woven felt, woven of spun yarn and then mechanically felted or fulled. A later development was found in the "batt-on-Base" construction consisting of a woven fabric base and a batt surface attached by needling. The needled batt-on-base felts are widely used today and have been said to be the "standard of the industry". However, a wide variety of other constructions are available, including non-woven press felts.

Important physical properties of a papermakers press felt are measured by four test measurements. They are:

1. Saturated moisture: a measure of the amount of water absorbed by the felt under static conditions. Expressed as pounds of water absorbed per pound of felt, saturated moisture is an excellent indicator of the ability of a felt to receive water from the sheet in the nip.

2. Vacuum dewatering: measures the ability of a felt or fabric running on a press to release water to a suction pipe.

3. Air permeability: measured in a dry felt, is expressed as cfm/sq. ft. of felt at 0.5 in. water pressure ($m^3/m^2$ per hr. at 10 mm water gauge).

4. Flow resistance: the water permeability of the felt or fabric.

Generally, the batt-on-base felts are advantageous in all four parameters, compared to the earlier conventional woven felt. However, as the speed of the papermaking machines has increased, so has the need for press felts which show an advantage in one or more of the desired physical properties.

One type of press felt which has been suggested is a composite of a woven or non-woven fabric base bearing a surface layer of a flexible, open-cell, polymeric resin foam. This layer, acting like a sponge would enhance the removal of water from the paper sheet. In addition, the inherent thermal insulation provided by the foam layer would impart some protection to the underlying fabric structure which is normally exposed completely to the degradative, hot water being pressed from the paper sheet. These composite felts have also shown good resistance to compaction.

Representative of the prior art concerned with the latter composite papermakers felts are the disclosures found in U.S. Pat. Nos. 1,536,533; 2,038,712; 3,059,312; 3,399,111 and 3,617,442.

The composite structure of the papermakers felts of the present invention are an improvement over many of the prior art composite felts in regard to their compression/recovery properties and their uniform void size and distribution. In addition, the method of their manufacture is an improvement over prior art manufacturing processes.

SUMMARY OF THE INVENTION

The invention comprises a method of manufacturing a composite wet-press felt fabric, which comprises;

providing a wet-press felt base fabric of interwoven machine direction and cross-machine direction yarns;

distributing a layer of loose particles of a synthetic, polymeric resin upon one surface of the base fabric; and fusing the loose particles under conditions whereby they bond together and with the base fabric, leaving pores between a plurality of particles.

The invention also comprises the wet-press fabric product of the method of the invention and belts made therefrom.

DETAILED DESCRIPTION OF THE PREFERRED EMBODIMENTS OF THE INVENTION

Figure 1:
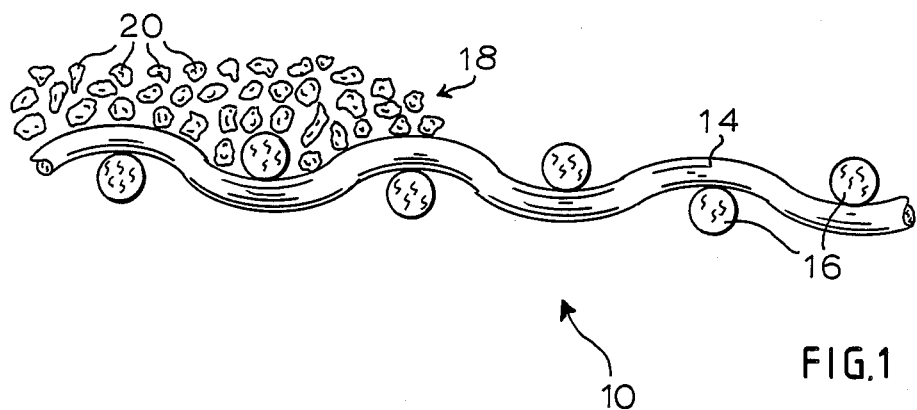
FIG. 1 is a cross-sectional, enlarged, side elevation of a portion of a preferred embodiment fabric of the invention in an initial stage of manufacture.

FIG. 1 is an enlarged side elevation of a fabric 10 of the invention in an initial stage of manufacture. The textile fabric 10 comprises a base layer and a surface layer. The base layer may be any conventional press felt fabric. As shown in FIG. 1, the base layer is preferably of interwoven machine direction (warp) 14 and cross-machine direction (weft) 16 textile yarns. The yarns may be spun yarns, spun from synthetic or natural staple fibers such as staple fibers of wool, cotton, polyolefins, polyamides, polyesters, mixtures thereof and the like. Alternatively, the yarns 18, 20 may be multifilament yarns of the same synthetic or natural fiber materials. Preferably the yarns 14, 16 are monofilament yarns, most preferably of polyester or polyamide resins.

The particular weave employed in providing the base layer is not critical and any conventional felt weave may be employed including a textile base or a base layer having only warp or only weft yarns. Thus, the base layer may be a single layer or a multi-layered weave construction and may include filling yarns or picks to control permeability of the fabric 10.

Advantageously, the denier of the yarns and the density of the weave is selected to provide a base layer weight of from about 4 to about 30 oz/square yard for optimum strength.

A surface layer 18 consists of a plurality of discrete, granular particles 20 of a synthetic, polymeric resin. Preferably, the particles 20 have an average diameter of from about 0.15 mm to about 5 mm, most preferably about 0.5 mm. By selecting the size of the granules and the distribution of the size as they are deposited on the base structure, the final void size and distribution can be controlled in the wet-press felt fabric of the invention. The particles 22 may be provided by chopping sheets of synthetic, flexible, polymeric resins. Representative of such synthetic polymeric resins are polyolefins such as polyethylene, polyurethanes, including polyether and polyester polyurethanes, and the like. The method of preparing such resins and chopping them into particulate forms is well-known to those skilled in the art. By selecting the polymer from which the granules are made and granular size, the compression characteristics of the final structure can be controlled.

In an initial step of the method of the invention, the particles 20 are distributed evenly on the upper layer of the base fabric.

Figure 2:
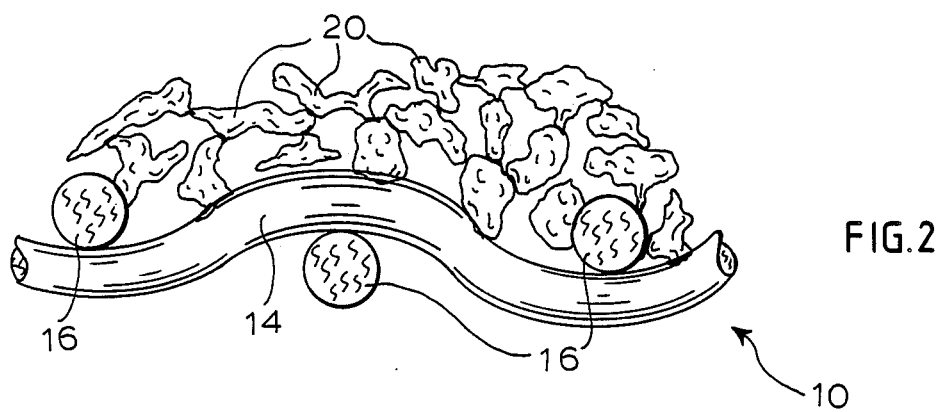
FIG. 2 is an exploded view of a portion of the fabric shown in FIG. 1, after completion of manufacture.

FIG. 2 is an enlarged view of the fabric 10 as shown in FIG. 1, but after completion of the manufacture thereof, by fusion of the particles 20. As can be seen in the FIG. 2, fusion of adjacent particles 20 leaves porosities between adjacent fused particles 20 so that the layer 18 is porous or permeable to fluids.

The fusion of the particles 20 may be accomplished in a number of known procedures. For example, the particles 20 may be fused by sintering, i.e., exposing the loose particles to temperatures above the softening point of the thermoplastic material of which the particles 20 are made, but below a degradative temperature so that adjacent touching particles 20 fuse together and with the woven fabric substrate to anchor thereon. Alternatively, a binding resin matrix may be added to adhere the particles 20 together and to the fabric substrate. Representative of binding resins which may be employed are high-temperature resistant resins such as polyamide and polyimide resins which are applied as liquids and which cure to a solid film under heat.

Figure 3:
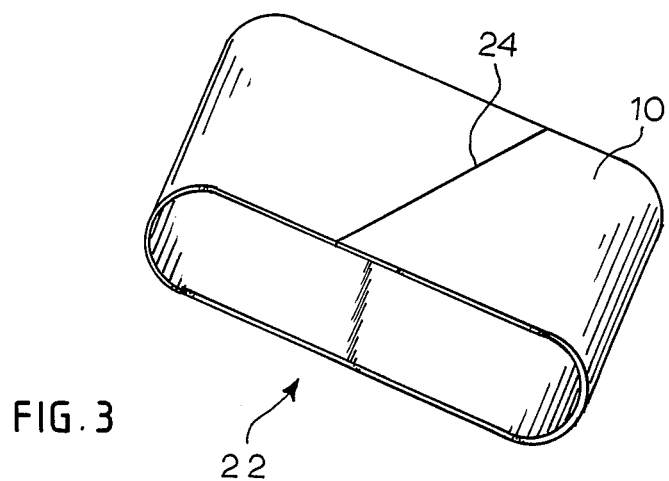
FIG. 3 is an isometric view of a wet press belt made from the fabric of FIG. 2.

FIG. 3 is a view-in-perspective of an embodiment endless belt 22 made up of fabric 10 as described above. The belt 22 is made endless by seam 24 joining the ends of the fabric 10.

There skilled in the art will appreciate that many modifications of the above-described preferred embodiments of the invention may be made without departing from the spirit and the scope of the invention. For example, the particles 20 of the invention described above may be replaced with fibers of the same synthetic, thermoplastic, polymeric resins. Thus, in another embodiment of the invention, batts of such fibers may be placed on the woven fabric substrate and fused to each other and the underlying substrate.

The batts may be of randomly oriented staple fibers such as synthetic polyamide, polyester, polyolefin and like fibers including blends thereof. Optionally, if desired, the fibers may be directionally oriented within the batts by methods known to the art.

The batts of staple fibers selected advantageously have a weight of from about 2 to about 20 oz./sq. yard. The staple fibers may have a wide denier range. The batts may be pre-needled using conventional techniques to obtain some integrity of the fibers prior to incorporation in the structure of fabric 10.

In the case of employing fibers in place of the particles 20, it is preferred that fusion of the fiber be accomplished under heat and pressure. The degree of temperature employed should be sufficient to soften the thermoplastic fibers without degrading them. The specific temperature will, of course, depend on the resin nature of the fibers. A pressure should be employed sufficient to flatten the fused fibers to the desired thickness of the final surface layer desired. The resulting fabric has a stable, smooth surface, free of fiber shedding and surface fuzz.

What is claimed:

1. A method of manufacturing a composite wet-press felt fabric, which comprises;
   providing a wet-press felt base fabric of interwoven machine direction and cross-machine direction yarn;
   distributing a layer of loose particles of a synthetic, polymeric resin upon one surface of the base fabric, and
   fusing the loose particles under conditions whereby they bond together and with the base fabric, leaving pores between a plurality of particles.
2. The product of the method of claim 1.

* * * * *